United States Patent
Rak et al.

(10) Patent No.: US 8,822,861 B2
(45) Date of Patent: Sep. 2, 2014

(54) KEYPAD ASSEMBLY FOR A PORTABLE ELECTRONIC DEVICE

(75) Inventors: Roman Rak, Waterloo (CA); Albert Murray Pegg, Cambridge (CA)

(73) Assignee: BlackBerry Limited, Waterloo (CA)

( * ) Notice: Subject to any disclaimer, the term of this patent is extended or adjusted under 35 U.S.C. 154(b) by 0 days.

(21) Appl. No.: 13/240,749

(22) Filed: Sep. 22, 2011

(65) Prior Publication Data

US 2012/0106104 A1    May 3, 2012

Related U.S. Application Data

(62) Division of application No. 12/033,976, filed on Feb. 20, 2008, now abandoned.

(51) Int. Cl.
*H01H 13/14* (2006.01)
*H01H 13/7065* (2006.01)
*G06F 3/023* (2006.01)

(52) U.S. Cl.
CPC ........... *H01H 13/7065* (2013.01); *H01H 13/14* (2013.01); *H01H 2221/058* (2013.01); *G06F 3/023* (2013.01); *H01H 2221/002* (2013.01); *H01H 2221/026* (2013.01); *H01H 2221/062* (2013.01); *H01H 2237/00* (2013.01); *H03K 2217/96042* (2013.01)
USPC ............................ 200/345; 200/344; 200/314

(58) Field of Classification Search
USPC .............. 200/345, 514, 512, 344; 174/153 G, 174/152 G
See application file for complete search history.

(56) References Cited

U.S. PATENT DOCUMENTS

| | | | |
|---|---|---|---|
| 4,998,318 A | 3/1991 | Nohtomi et al. | |
| 5,185,490 A | 2/1993 | Vandervoort | |
| 6,770,824 B1* | 8/2004 | Faucher | 200/296 |
| 6,960,733 B2* | 11/2005 | Hanahara et al. | 200/314 |
| 2006/0118400 A1 | 6/2006 | Chyc et al. | |

FOREIGN PATENT DOCUMENTS

EP    0386364 A2    9/1990

OTHER PUBLICATIONS

Extended European Search Report; Application No. 08151664.3; Dated Aug. 27, 2008.

* cited by examiner

*Primary Examiner* — Felix O Figueroa
(74) *Attorney, Agent, or Firm* — Ridout & Maybee LLP (57) ABSTRACT

A friction device, keypad assembly and portable electronic device are disclosed. In one embodiment, there is provided a keypad assembly for a portable electronic device, comprising: a keypad having a number of keys each having an actuator post attached to a back side thereof; a circuit board; a light guide located between the keypad and the circuit board, the light guide defining a number of holes which provide paths for respective actuator posts to travel through to contact respective electrical switches on the circuit board; and at least one friction device located in one of the holes of the light guide, the friction device providing a physical barrier limiting movement of the actuator post in a direction normal to a direction of actuation, the friction device applying friction to at least one side of the actuator post and resisting movement of the actuator post in the direction of actuation.

15 Claims, 8 Drawing Sheets

КЕYPAD ASSEMBLY FOR A PORTABLE
ELECTRONIC DEVICE

CROSS-REFERENCE TO RELATED
APPLICATIONS

This application is a divisional of U.S. patent application Ser. No. 12/033,976, filed Feb. 20, 2008, the content of which is incorporated herein by reference.

TECHNICAL FIELD

The present disclosure relates generally to portable devices, and more particularly to a device providing an improved keypad assembly for a portable electronic device.

Portable electronic devices, such as cellular phones, personal digital assistants, pagers, etc., have become increasingly popular among consumers. Many portable electronic devices have miniature integrated buttons, keyboards, or keypads of one variety or another. One variety of keyboard or keypad that is used in portable electronic devices is commonly referred to as a film-in-plastic (FIP) keypad, also known as an in-mould-decoration (IMD) keypad.

Conventional FIP or IMD keypads are generally difficult to affix in place. As a result, the keypad may move around or vibrate, radiating audible frequencies that may enter into a microphone of the portable electronic device, causing unwanted noise or interference during a telephone conversation or voice recording on the device.

BRIEF DESCRIPTION OF THE DRAWINGS

Reference will now be made to the drawings, which show by way of example, embodiments of the present disclosure, and in which:

FIG. 7b shows a front plan view of the friction device shown in FIG. 7a;

It will be noted that throughout the appended drawings, like features are identified by like reference numerals.

DETAILED DESCRIPTION OF EXAMPLE
EMBODIMENTS

One aspect of the description may provide a friction device for use in a hole of a light guide of a keypad assembly of a wireless device, the light guide being located between a keypad and a circuit board of the wireless device, the hole providing a path for an actuator post of a key of the keypad to travel through to contact a respective switch on the circuit board, the friction device comprising: a grommet having at least one interference zone for contacting the actuator post, wherein the at least one interference zone limits movement of the actuator post in a direction normal to the direction of actuation, the grommet applying friction to at least one side of the actuator post and resisting movement of the actuator post in the direction of actuation.

Another aspect of the description may provide a friction device for use in a hole of a light guide of a keypad assembly of a wireless device, the light guide being located between a keypad and a circuit board of the wireless device, the hole providing a path for an actuator post of a key of the keypad to travel through to contact a respective switch on the circuit board, the friction device comprising: at least one member for contacting the actuator post attached to an inside dimension of the hole of the light guide, wherein the at least one member limits movement of the actuator post in a direction normal to the direction of actuation, the grommet applying friction to at least one side of the actuator post and resisting movement of the actuator post in the direction of actuation.

A further aspect of the description may provide a keypad assembly for a wireless device. The keypad assembly may comprise a keypad portion having a number of keys for physical actuation where each of the keys has an actuator post attached to a back side of the key. The keypad may further comprise a circuit board having one or more electrical switches where the electrical switches correspond to the keys of the keypad. The keypad may further have a light guide located between the keypad portion and the circuit board. The light guide may have a number of holes formed therein. The holes may provide paths for respective actuator posts of the keys to travel through to contact the respective electrical switches on the circuit board. The keypad may also have at least one friction device located in at least one of the holes of the light guide. The friction device may provide a physical barrier limiting movement of the actuator post in a direction normal to the direction of actuation and the friction device applies friction to at least one side of the actuator post, thereby resisting movement of the actuator post in the direction of actuation.

Yet a further aspect of the description may provide a device for use in a hole of a light guide of a keypad assembly of a wireless device. The light guide may be located between a keypad and a circuit board of the wireless device and the hole provides a path for an actuator post of a key of the keypad to travel through to contact a respective switch on the circuit board. The device may comprise a grommet having at least one interference zone for contacting the actuator post, the grommet having an outside dimension approximately equal to or greater than an inside dimension of the hole in the light guide. The interference zones may be raised portions that extend inwardly from the inside dimension of the grommet, thereby decreasing the inside dimension of the grommet over a portion of the inside dimension of the grommet.

Yet a further of the description may provide a portable wireless device having a keypad assembly. The keypad assembly may comprise a circuit board, a keypad portion, a light guide, and at least one friction device. The keypad portion has a number of keys for physical actuation where each of the keys has an actuator post attached to a back side of the key. The circuit board may have one or more electrical switches corresponding to the keys of the keypad. The light guide may be located between the keypad portion and the circuit board. The light guide may have a number of holes formed therein, where the holes provide paths for respective actuator posts of the keys to travel through to contact the respective electrical switches on the circuit board. The at least one friction device may be located in at least one of the holes of the light guide, the friction device providing a physical barrier limiting movement of the actuator post in a direction normal to the direction of actuation and the friction device applying friction to at least one side of the actuator post, thereby resisting movement of the actuator post in the direction of actuation.

Figure 1:
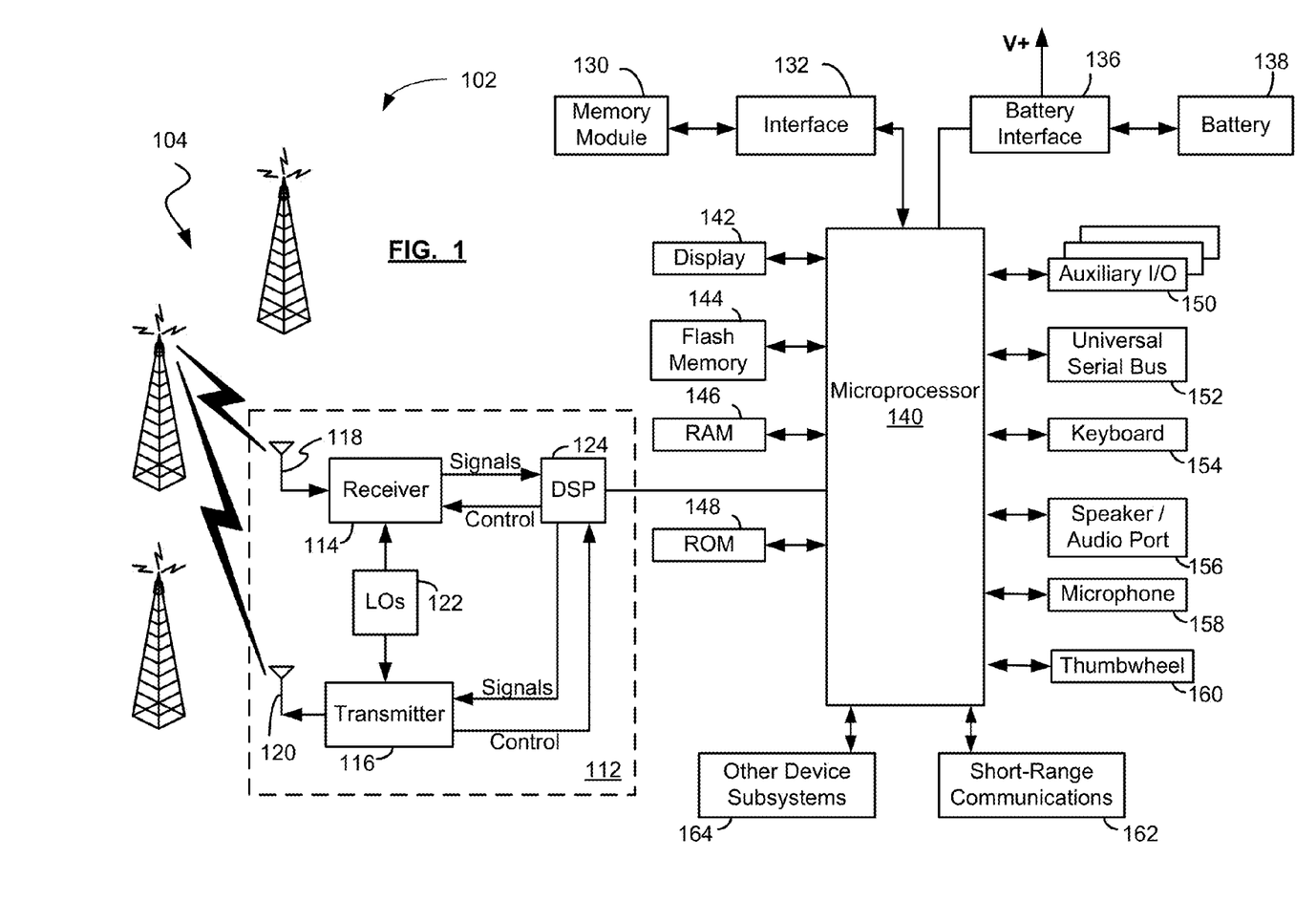
FIG. 1 shows in block diagram form a wireless device suitable for having a keypad in accordance with one embodiment.

Reference is first made to FIG. 1, which shows a block diagram illustrating a portable wireless device 102 that has a keyboard or keypad in accordance with one embodiment of the present disclosure. The wireless device 102 communicates through a wireless communication network 104. The wireless network 104 includes antenna, base stations, and supporting radio equipment as for supporting wireless communications between the wireless device 102 and other devices connected to wireless network 104. The wireless network 104 may be coupled to a wireless network gateway and to a wide area network, shown in FIG. 2.

In one embodiment, the wireless device 102 is a two-way communication device having at least voice and/or data communication capabilities, including the capability to communicate with other computer systems. In one embodiment, the wireless device 102 is a handheld device. Depending on the functionality provided by the wireless device 102, it may be referred to as a data messaging device, a two-way pager, a cellular telephone with data messaging capabilities, a wireless Internet appliance, a data communication device (with or without telephony capabilities), or a portable media or music player. The wireless device 102 may communicate with any one of a plurality of fixed transceiver stations within its geographic coverage area.

The wireless device 102 may incorporate a communication subsystem 112, which includes a receiver 114, a transmitter 116, and associated components, such as one or more antenna elements 118 and 120, local oscillators (LOs) 122, and a processing module such as a digital signal processor (DSP) 124. In one embodiment, the antenna elements 118 and 120 may be embedded or internal to the wireless device 102. As will be apparent to those skilled in the field of communications, the particular design of the communication subsystem 112 depends on the wireless network 104 in which the wireless device 102 is intended to operate.

The wireless device 102 may send and receive communication signals over the wireless network 104 after the required network registration or activation procedures have been completed. Signals received by the antenna 118 through the wireless network 104 are input to the receiver 114, which may perform such common receiver functions as signal amplification, frequency down conversion, filtering, channel selection, etc., as well as analog-to-digital (A/D) conversion. A/D conversion of a received signal allows more complex communication functions such as demodulation and decoding to be performed in the DSP 124. In a similar manner, signals to be transmitted are processed, including modulation and encoding, for example, by the DSP 124. These DSP-processed signals are input to the transmitter 116 for digital-to-analog (D/A) conversion, frequency up conversion, filtering, amplification, and transmission to the wireless network 104 via the antenna 120. The DSP 124 not only processes communication signals, but also provides for receiver and transmitter control. For example, the gains applied to communication signals in the receiver 114 and the transmitter 116 may be adaptively controlled through automatic gain control algorithms implemented in the DSP 124.

Network access is associated with a subscriber or user of the wireless device 102 via a memory module, such as a memory module 130, which may be a Subscriber Identity Module (SIM) card for use in a GSM network or a USIM card for use in a UMTS. The SIM card is inserted in or connected to an interface 132 of the wireless device 102 in order to operate in conjunction with the wireless network 104. Alternatively, the wireless device 102 may have an integrated identity module for use with systems such as Code Division Multiple Access (CDMA) systems.

The wireless device 102 also includes a battery interface 136 for receiving one or more rechargeable batteries 138. The battery 138 provides electrical power to at least some of the electrical circuitry in the wireless device 102, and the battery interface 136 provides a mechanical and electrical connection for the battery 138. The battery interface 136 is coupled to a regulator (not shown) which provides power V+ to the circuitry of the wireless device 102.

The wireless device 102 includes a microprocessor 140 which controls the overall operation of the wireless device 102. Communication functions, including at least data and voice communications, are performed through the communication subsystem 112. The microprocessor 140 also interacts with additional device subsystems such as a display 142, a flash memory 144, a random access memory (RAM) 146, a read-only memory (ROM) 148, auxiliary input/output (I/O) subsystems 150, a Universal Serial Bus (USB) port 152, a keyboard or keypad 154, a speaker or audio port 156 for connecting to, for example a set of headphones, a microphone 158, a clickable thumbwheel, thumbwheel, or set of scroll buttons 160, a short-range communications subsystem 162, and any other device subsystems generally designated as 164. Some of the subsystems shown in FIG. 1 perform communication-related functions, whereas other subsystems may provide "resident" or on-device functions. Notably, some subsystems, such as the keypad 154, the display 142, and the clickable thumbwheel 160, for example, may be used for both communication-related functions, such as entering a text message for transmission over the wireless network 104, and executing device-resident functions such as a calculator or task list. Operating system software used by the microprocessor 140 is preferably stored in a persistent store such as the flash memory 144, which may alternatively be the ROM 148 or similar storage element. Those skilled in the art will appreciate that the operating system, specific device applications, or parts thereof, may be temporarily loaded into a volatile store such as the RAM 146.

The microprocessor 140, in addition to its operating system functions, enables execution of software applications on the wireless device 102. A predetermined set of applications that control basic device operations, including data and voice communication applications, will normally be installed on the wireless device 102 during or after manufacture. The wireless device 102 may include a personal information manager (PIM) application having the ability to organize and manage data items relating to a user such as, but not limited to, instant messaging, email, calendar events, voice mails, appointments, and task items.

The PIM and/or media applications have the ability to send and receive data items via either the wireless network 104 or a link to a computer system. The link to the computer system may be via the serial port 152 or the short-range communications subsystem 162. Additional applications may also be loaded onto the wireless device 102 through the wireless network 104, the auxiliary I/O subsystem 150, the serial port 152, the short-range communications subsystem 162, or any other suitable subsystem 164, and installed by a user in the RAM 146 or a non-volatile store such as the ROM 148 for execution by the microprocessor 140. Such flexibility in application installation increases the functionality of the wireless device 102 and may provide enhanced on-device functions, communication-related functions, or both. For example, secure communication applications may enable electronic commerce functions and other such financial transactions to be performed using the wireless device 102.

In a data communication mode, a received data signal representing information such as a text message, an email message, a media file to be transferred, or Web page download will be processed by the communication subsystem 112 and input to the microprocessor 140. The microprocessor 140 will further process the signal for output to the display 142 or alternatively to the auxiliary I/O device 150. A user of the wireless device 102 may also compose data items, such as email messages, for example, using the keypad 154 and/or the clickable thumbwheel 160 in conjunction with the display 142 and possibly the auxiliary I/O device 150. The keypad 154 may be either a complete alphanumeric keypad or telephone-type keypad. In one embodiment, the keypad 154 may be a film-in-plastic (FIP) or in-mould-decoration (IMD) keypad, which is described in more detail below in connections with FIGS. 5-8.

For voice communications, the overall operation of the wireless device 102 is similar, except that the received signals would be output to the speaker or audio port 156 and signals for transmission would be generated by a transducer such as the microphone 158. Alternative voice or audio I/O subsystems, such as a voice message recording subsystem, may also be implemented on the wireless device 102. Although voice or audio signal output is typically accomplished primarily through the speaker or audio port 156, the display 142 may also be used to provide an indication of the identity of a calling party, duration of a voice call, or other voice call related information. Stereo headphones may also be used in place of the speaker 156.

The serial port 152 is normally implemented in a personal digital assistant (PDA) type communication device for which synchronization with a user's computer is a desirable, albeit optional, component. The serial port 152 enables a user to set preferences through an external device or software application and extends the capabilities of the wireless device 102 by providing for information, media file, or software downloads to the wireless device 102 other than through the wireless network 104.

The short-range communications subsystem 162 is an additional optional component which provides for communication between the wireless device 102 and different systems or devices, which need not necessarily be similar devices. For example, the subsystem 162 may include an infrared device and associated circuits and components, or a wireless bus protocol compliant communication mechanism such as a Bluetooth™ communication module to provide for communication with similarly-enabled systems and devices (Bluetooth™ is a registered trademark of Bluetooth SIG, Inc.). In another embodiment, the short-range communications subsystem 162 may be a wireless networking communications subsystem, conforming to IEEE 802.11 standards such as 802.11b, 802.11g, and/or 802.11n.

Figure 2:
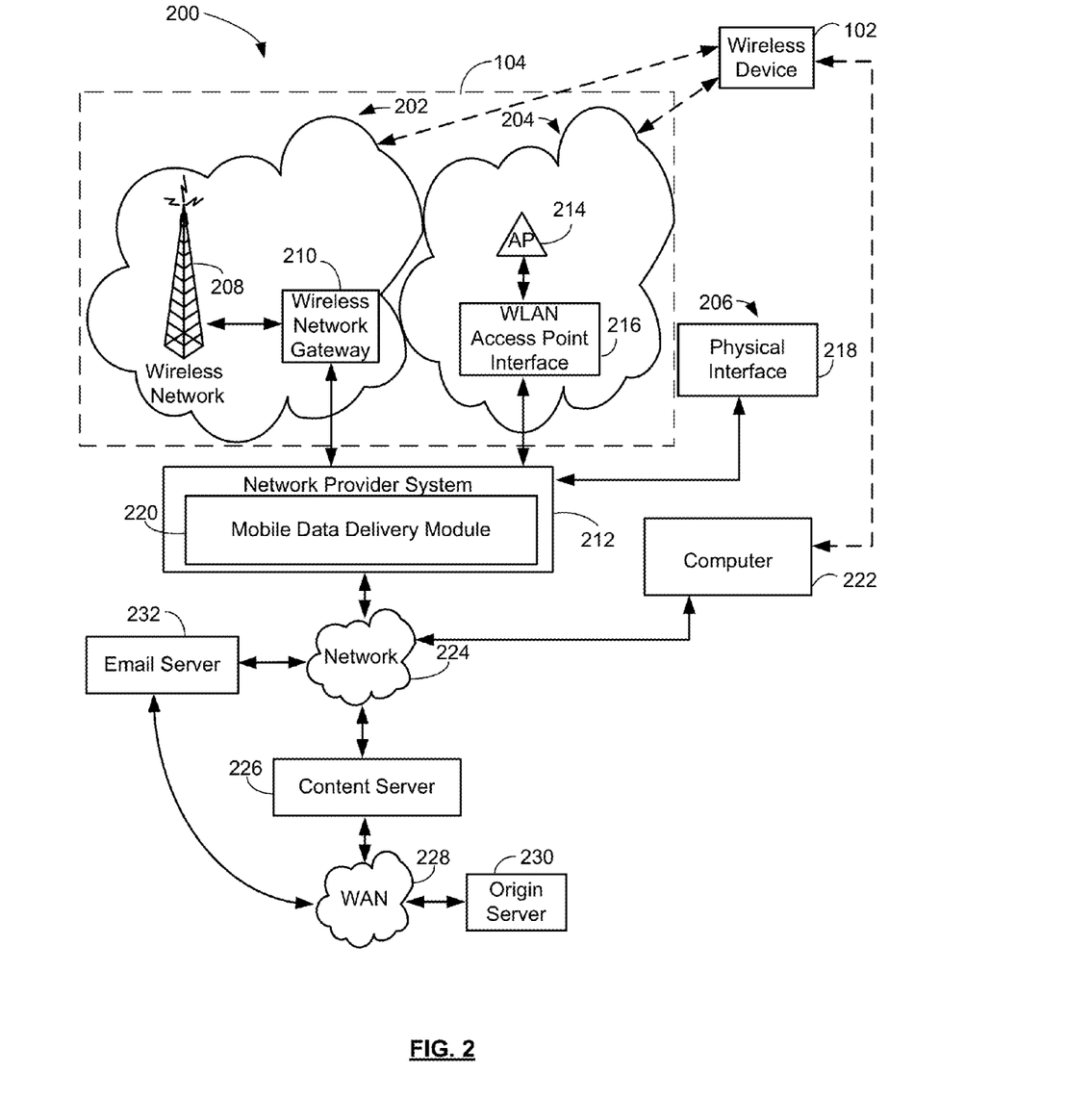
FIG. 2 shows in block diagram form a communication system suitable for providing the operating environment of the wireless device of FIG. 1 in accordance with one embodiment.

Reference is next made to FIG. 2, which shows a communication system 200 suitable for use with the wireless device 102 shown in FIG. 1. The communication system 200 generally includes one or more wireless devices 102 (only one of which is shown in FIG. 2) and the wireless network 104. The wireless network 104 may include a wireless Wide Area Network (WAN) 202, a Wireless Local Area Network (WLAN) 204, and/or other interfaces 206 (which may not necessarily be wireless).

Referring to FIG. 2, the wireless WAN 202 may be implemented as a packet-based cellular or mobile network that includes a number of base stations 208 (one of which is shown in FIG. 2) where each of the base stations 208 provides wireless Radio Frequency (RF) coverage to a corresponding area or cell. The wireless WAN 202 is typically operated by a cellular network service provider that sells subscription packages to users of the wireless devices 102. The wireless WAN 202 comprises a number of different types of networks, for example, Mobitex Radio Network, DataTAC, GSM (Global System for Mobile Communication), GPRS (General Packet Radio System), TDMA (Time Division Multiple Access), CDMA (Code Division Multiple Access), CDPD (Cellular Digital Packet Data), iDEN (integrated Digital Enhanced Network) or various other third generation networks such as EDGE (Enhanced Data rates for GSM Evolution), UMTS (Universal Mobile Telecommunications Systems), or Evolution-Data Optimized (EV-DO).

As shown in FIG. 2, the communications system 200 also includes a wireless network gateway 210 and one or more network provider systems 212. The wireless network gateway 210 provides translation and routing services between the network provider system(s) 212 and the WAN 202, which facilitates communication between the wireless devices 102 and other devices (not shown) connected, directly or indirectly, to the network provider system 212.

The WLAN 204 comprises a network which in some examples conforms to IEEE 802.11 standards such as 802.11b, 802.11g, and/or 802.11n; however, other communications protocols may also be used for the WLAN 204. The WLAN 204 includes one or more wireless RF Access Points (AP) 214 (one of which is shown in FIG. 2) that collectively provide a WLAN coverage area. For the embodiment depicted in FIG. 2, the WLAN 204 is operated by an enterprise (for example, a business or university in a building or campus type environment) and the access points 214 are connected to an access point (AP) interface 216. The AP interface 216 provides translation and routing services between the access points 214 and the network provider system 212 to facilitate communication between two or more of the wireless devices 102 and other devices (e.g., such as desktop computers) connected, directly or indirectly, to the network provider system 212. The AP interface 216 is implemented using a computer, for example, a server running a suitable computer program or software.

According to one embodiment, the other interfaces 206 may be implemented using a physical interface indicated by reference 218. The physical interface 218 includes an Ethernet, Universal Serial Bus (USB), Firewire, or infrared (IR) connection implemented to exchange information between the network provider system 212 and the wireless device 102.

The network provider system 212 comprises a server or server modules or a number of servers or server modules which are typically located behind a firewall (not shown). The network provider system 212 may include a number of modules including a mobile data delivery module 220. Various modules running on the network provider system 212 may be implemented as a number of services running on a single server or as a number of interconnected servers each running a software program to implement the functionality of the respective module. The network provider system 212 provides access for the wireless devices 102, through either the wireless WAN 202, the WLAN 204, or the other connection 206 to the devices connected, for example, through an enterprise network 224 (e.g., an intranet), to the network provider system 212. In one embodiment, the data delivery module 220 is implemented on a computer, such as the network provider system 212.

The enterprise network 224 comprises a local area network, an intranet, the Internet, a direct connection, or combinations thereof. The enterprise network 224 may comprise an intranet for a corporation or other type of organization. In at least some embodiments, the network provider system 212 is part of the enterprise network 224, and is located behind a corporate firewall and connected to the wireless network gateway 210 through the Internet. A computer 222 (e.g., a desktop or laptop computer) belonging to the user of the wireless device 102 is typically connected to the enterprise network 224. As described earlier, the wireless device 102 may be temporarily and directly connected to the computer 222 using, for example, the serial port 152. This direct connection may make use of a cradle or docking station connected to a serial port of the computer 222, where the mobile device 102 is placed in the cradle, therefore completing the serial connection between the mobile device 102 and the computer 222. Alternatively, the wireless device 102 may communicate with the computer 222 using the communication subsystem 112 and the WAN 202 and/or the short-range communications subsystem 162 and the WLAN 204.

As shown in FIG. 2, an application/content server 226 may be connected to the enterprise network 224 and also to another network, for example a Wide Area Network (WAN) 228. In some embodiments, an email server 232 and/or the content server 226 form part of the enterprise network 224. The WAN 228 may further connect to other networks. The WAN 228 may comprise or be configured with the Internet, a direct connection, a LAN, a wireless communication link, or any combination thereof. Content providers, such as Web servers, may be connected to the WAN 228, an example of which is shown in FIG. 2 as an origin server 230.

According to one embodiment, the mobile data delivery module 220 provides connectivity between the wireless WAN 202 and the WLAN 204 and the other connection 206 and devices and/or networks connected directly or indirectly to the network provider system 212. In one embodiment, the connectivity provided may be Hypertext Transfer Protocol (HTTP) based connectivity providing an Internet based service connection to devices connected to the wireless WAN 202, the WLAN 204, or the other connection 206 and devices and/or networks connected directly or indirectly to the network provider system 212. The network 224, the application/content server 226, the WAN 228, and the origin server 230, are individually and/or collectively in various combinations a content source for the network provider system 212. It will be appreciated that the system shown in FIG. 2 comprises but one possible communication network or configuration of a multitude of possible configurations for use with the wireless devices 102.

Figure 3:
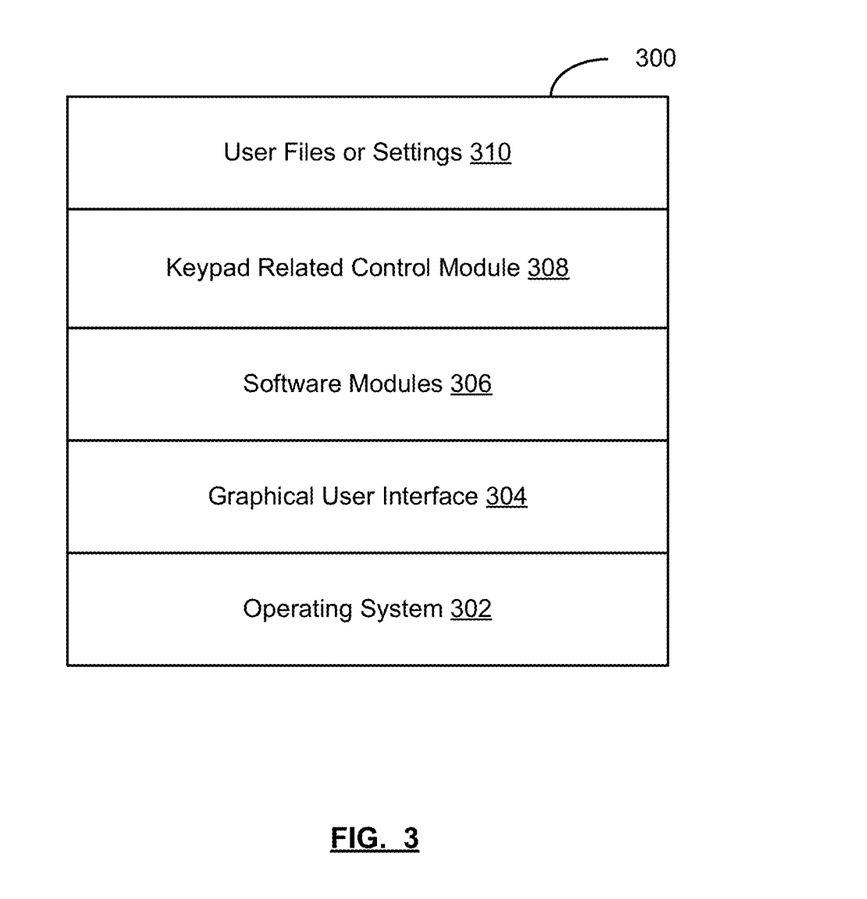
FIG. 3 shows in block diagram form the contents of a memory of the wireless device of FIG. 1.

Reference is next made to FIG. 3, which shows a block diagram illustrating a memory 300 of the wireless device 102. The memory 300 has various software components for controlling the wireless device 102 and may include, for example, the flash memory 144, the RAM 146, the ROM 148, the memory module 130 and/or the other device subsystems 164. In accordance with one embodiment, the wireless device 102 is intended to be a multi-tasking wireless communications device configured for sending and receiving data items and for making and receiving voice calls that also includes various applications enabling users to listen to music, watch video files, play games, view picture files, surf the internet wirelessly, etc. To provide a user-friendly environment to control the operation of the wireless device 102, an operating system (OS) 302 resident on the wireless device 102 provides a basic set of operations for supporting various applications typically operable through a graphical user interface (GUI) 304. For example, the operating system 302 provides basic input/output system features to obtain input from the auxiliary I/O 150, the keypad 154, the clickable thumbwheel 160, and other input devices, and to facilitate output to the user via the display 142. The GUI 304 is typically a component of the operating system 302. One or more software modules 306 for managing communications or providing a personal digital assistant (PDA) or other functions may also be included.

The memory 300 also includes an email and calendar client, which may be combined in, for example, a PIM application having email-based calendaring and scheduling functions. Typically, the PIM is installed as one of the software modules 306. The memory 300 also includes a keypad related control module 308 for managing I/O function related to the keypad 154 of the wireless device 102. The keypad control module 308 may be part of the operating system 302. Further, the memory 300 typically includes a number of user files or settings 310 which store, for example, media or document files belonging to the user and configuration settings for various applications.

Thus, the wireless device 102 includes computer executable programmed instructions for directing the wireless device 102 to implement various applications. The programmed instructions may be embodied in the one or more software modules 306 resident in the memory 300 of the wireless device 102. Alternatively, the programmed instructions may be tangibly embodied on a computer readable medium (such as a DVD, CD, floppy disk or other storage media) which may be used for transporting the programmed instructions to the memory 300 of the wireless device 102. Alternatively, the programmed instructions may be embedded in a computer-readable, signal-bearing medium that is uploaded to the wireless network 104 by a vendor or supplier of the programmed instructions, and this signal-bearing medium may be downloaded through one or more of the interfaces 112, 150, 152, 162 to the wireless device 102 from, for example, the wireless network 104 by end users.

Figure 4:
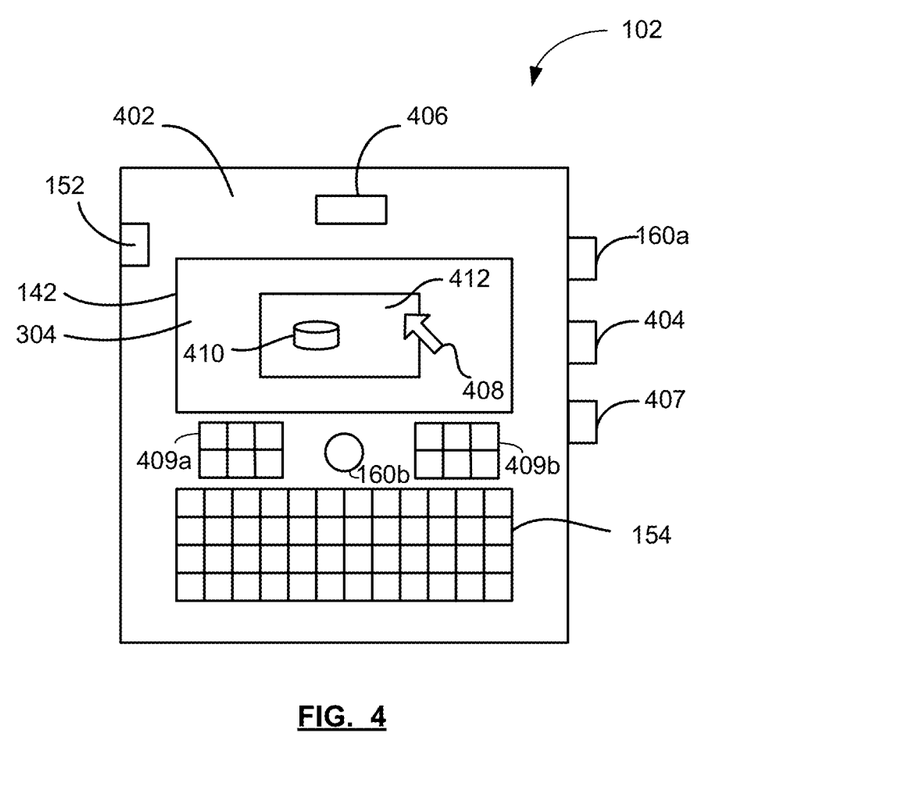
FIG. 4 is a front view illustrating the wireless device of FIG. 1.

Reference is next made to FIG. 4, which shows a front view of the wireless device 102. As mentioned above, the wireless device 102 may be a data and voice-enabled handheld device. The wireless device 102 includes a casing 402, the data or serial port 152, the display screen 142, the graphical user interface (GUI) 304, the keypad 154, the clickable thumbwheel or scroll buttons 160a or other device for navigation such as a trackball 160b, one or more input buttons 404 (e.g., select, cancel, talk, play, stop, fast forward, rewind, next, previous buttons), signal inputs/outputs 406 (e.g., direct wire connection or inductive coupling power connector input, microphone, speaker, data interface input, etc.), and an audio port 407. Additionally, the wireless device 102 may have a number of navigation control buttons represented by numerals 409a and 409b. The navigation control buttons 409 may provide a number of functions such as a send and/or end key for a mobile telephone application of the wireless device 102, a menu key, an escape key, etc. The functions of the navigation control buttons 409 may be user configurable. Internally, the wireless device 102 includes one or more circuit boards (not shown), the microprocessor 140 (FIG. 1), the memory 300 (FIG. 3), the battery 138 (FIG. 1), the antennae 118, 120

(FIG. 1), etc., which may all be coupled to the signal inputs/outputs 406, the keypad 154, the display screen 142, the clickable thumbwheel 160, etc.

The microprocessor 140 is typically coupled to one or more input devices (e.g., the buttons 404, the keypad 154, the clickable thumbwheel 160) for receiving user commands or queries and the display 142 for displaying the results of these commands or queries. For example, user queries may be transformed into a combination of commands for producing one or more tables of output data which may be incorporated in one or more display pages for presentation to the user. The microprocessor 140 is also coupled to the memory 300.

A user may interact with the wireless device 102 and its software modules 306 using the GUI 304. The GUI 304 is controlled by the operating system 302 (FIG. 3) and provides a display format enabling the user to choose commands, execute application programs, manage computer files, and perform other functions by selecting pictorial representations (i.e., icons), or selecting items from a menu through the use of an input or pointing device such as the clickable thumbwheel 160 and/or the keypad 154. Generally, the GUI 304 is used to convey information and receive commands from users and generally includes a variety of GUI objects or controls including icons, toolbars, drop-down menus, pop-up menus, text, dialog boxes, buttons, etc. A user typically interacts with the GUI 304 presented on the display 142 by using an input or pointing device to position a pointer or cursor 408 over an object 410 (i.e., "pointing" at the object) and by "clicking" on the object 410 (e.g., by depressing the thumbwheel 160 or a button on the keyboard 154, etc.). This is often referred to as a point-and-click or selection operation. Typically, the object 410 may be highlighted (e.g., shaded) when it is selected or pointed at by the pointer or cursor 408 to indicate that the object 410 is selectable.

Typically, a GUI-based system presents application, status, and other information to the user in windows appearing on the display 142. A window 412 is a display area shown within the display 142, typically rectangular, in which a user may view an application or document. The window 412 may be open, closed, displayed full screen, reduced to an icon, increased or reduced in size, or moved to different areas of the display 142. Multiple windows 412 may be displayed simultaneously. For example, the windows 412 may be displayed within other windows, overlapped with other windows, or tiled within the display area.

Figure 5:
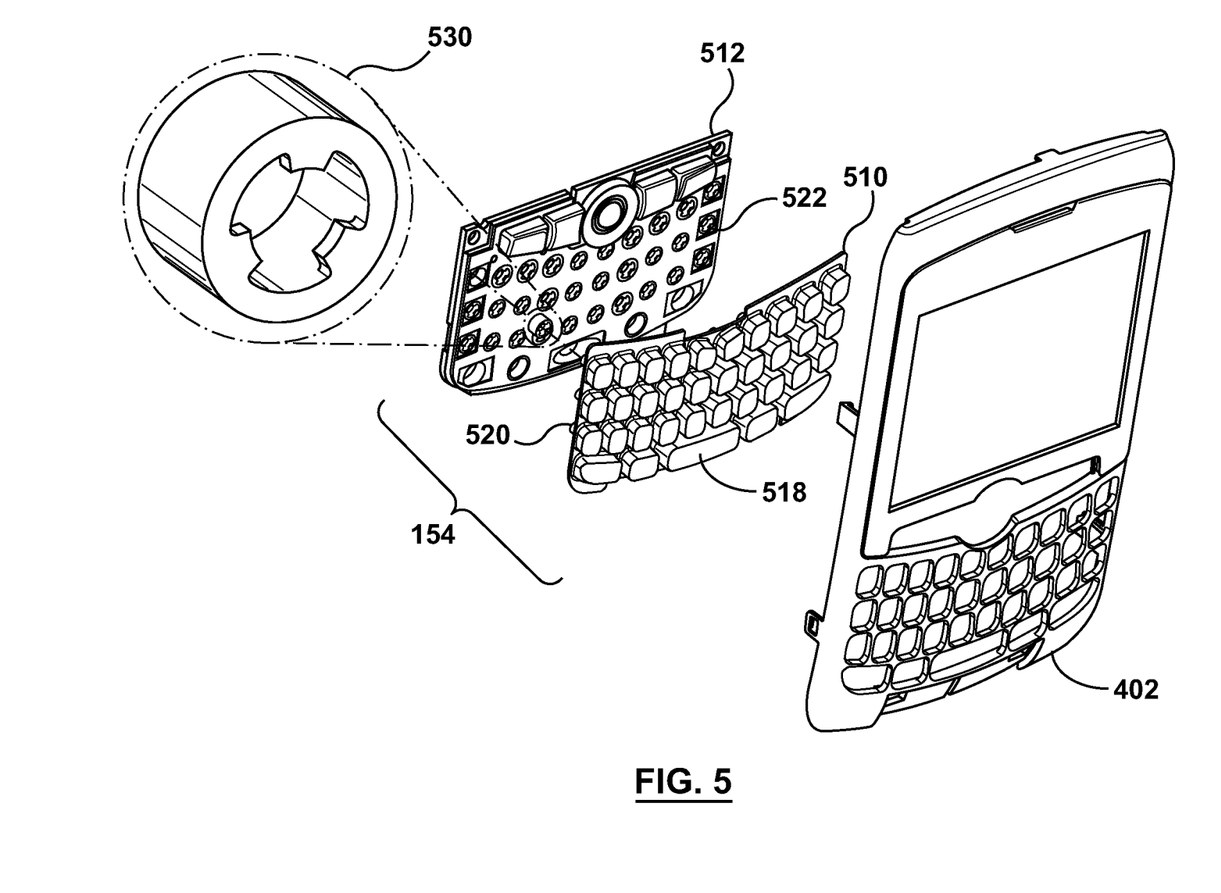
FIG. 5 shows an exploded perspective view illustrating various components and the assembly of a keypad suitable for use with the wireless device of FIG. 1.
Figure 6:
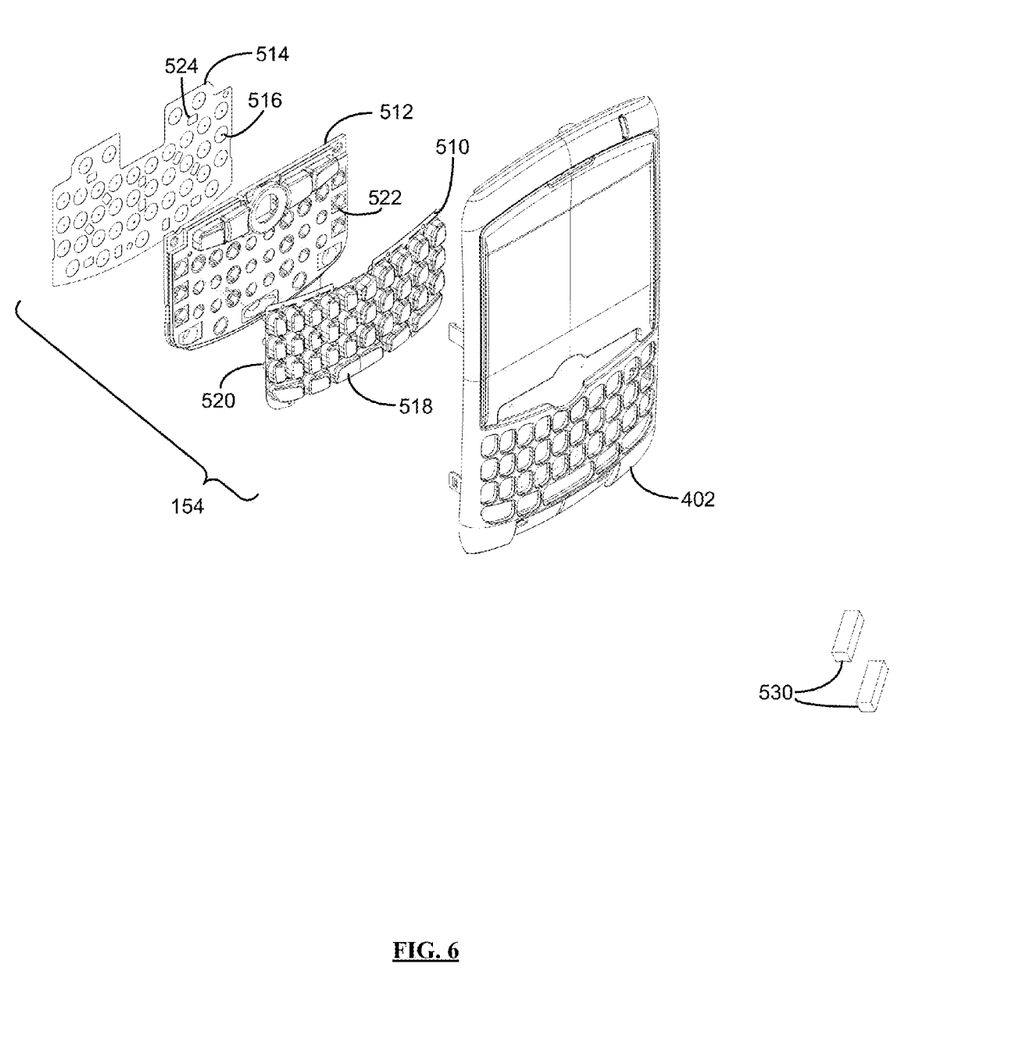
FIG. 6 shows an alternative exploded perspective view illustrating various components and the assembly of a keypad suitable for use with the wireless device of FIG. 1.

Reference is next made to FIGS. 5 and 6, which show exploded perspective views illustrating the various components and the assembly of the keypad 154 suitable for use with the wireless device of FIG. 1. As shown in FIGS. 5 and 6, the keypad 154 includes a keypad portion 510, a light guide 512, an electrical switch assembly or printed circuit board (PCB) 514 (FIG. 6) and the casing 402. In one example, the electrical switch assembly 514 may include a number of dome switches 516, typically one dome switch 516 for each key. In one example, the keypad portion 510 may be a film-in-plastic (FIP) or an in-mould-decoration (IMD) keypad having a number of keys 518. In one example, the casing 402 may be bezel frame having a separate hole in the housing or casing 402 for each of the keys 518. The keys 518 each have a contact surface on the front side where a user may push down on a particular key and an actuator post 520 (shown more clearly in connection with FIG. 6) connected to the back side of each key 518. When the user depresses the front surface of a key 518, the actuator post 520 of the respective key 518 travels in the direction of actuation and contacts a respective dome switch 516 (FIG. 6) thereby closing an electrical contact of the associated electrical dome switch 516 allowing the processor 140 to detect the key depression.

The light guide 512 includes a number of holes 522 through which the actuator posts 520 travel in order to contact the electrical switches 516. The electrical switch assembly 514 also includes a number of optional light emitting diodes 524 (FIG. 6) that emit light. The light emitted by the light emitting diodes 524 travels through and/or is refracted through the light guide 512, which in one example may be constructed of acrylic, and arrives at the keypad portion 510, thereby illuminating the keypad portion 510 when the user wishes to use the portable wireless device 102 in dark locations. The holes 522 of the light guide 512 have an inside diameter that is larger than the outside diameter of the actuator posts 520, connected to the back side of the keys 518. This allows for easy assembly of the keypad 154 and provides the actuator posts 520 with enough clearance to freely travel in the direction of actuation when the respective keys 518 are depressed by the user. However, this larger diameter of the holes 522 also allows the actuator posts 520 to travel laterally with respect to the light guide 512, thereby allowing the entire keypad portion 510 to travel laterally as much as is permitted by the casing 402 bezel frame that surrounds each of the keys 518. Additionally, the larger diameter of the holes 522, with respect to the actuator posts 520, means that the actuator posts 520 are generally not contacting the inside diameter of the holes 522. Rather, the actuator posts 520 float freely within the holes 522. This provides an additional degree of freedom to the keys 518, allowing the keys 518 to travel freely in the direction of actuation, as much as is permitted by the casing 402 bezel frame that surrounds each of the keys 518 and contacts the top surface of the keypad portion 510 in between the keys 518.

The embodiment of the keypad 154 where the keypad 154 interacts with the casing 402 that is a bezel frame having a separate hole for each of the keys 518 has many beneficial characteristics compared to alternative designs, including the prevention of key wobble and better ergonomics. However, the freedom of the keys 518 to move, to some extent, in all three spatial directions can sometimes result in vibration or rattling, which is undesirable in devices such as the portable wireless device 102, which may include a microphone 158 for voice recording or voice calls.

The freedom of the keys 518 may be limited with the use of a friction device 530, which is placed inside at least one of the holes 522. In one example, the friction device 530 may be a grommet and the friction device 530 has an outside dimension that is equal to or greater than the inside dimension of the hole 522, so as to be suitably secured within the hole 522. The friction device 530 contacts the sides of the respective actuator posts 520, thereby restricting the lateral motion of actuator posts 520 (also referred to as movement of the actuator post 520 in a direction normal to the axis of the friction device) and, as a result, the entire keypad portion 510. Additionally, since the friction device 530 also applies friction to the sides of the actuator posts 520, the friction device 530 also makes it more difficult for the actuator posts 520 to travel in the direction of actuation without an associated threshold force being applied to the top of the keys 518 by the user. In the event that the friction device 530 is found to apply too much friction to the side of the actuator posts 520, this can be counteracted with appropriate choice of the dome switches 516. For example, 1.0, 1.35, and 1.6 Newton dome switches are readily available in the market place. Therefore, if the use of the friction device 530 is found to make it too difficult for the user to depress the keys 518, a dome switch that requires less force to be actuated may be selected for use with the keypad assembly 154.

In one aspect, the dimensions and material of the friction device 530 are suitably chosen so as to interfere with the sides of the actuator posts 520 at the tolerance limits of the actuator post 520 and hole 522 interface. The friction device 530 applies enough friction to the sides of the actuator post 520 to substantially reduce the likelihood that a key 518 will travel in the direction of actuation without the key being depressed by the user of the wireless device 102. The friction device 530 also serves as a physical barrier to limit the lateral movement of the actuator post 520. Both of these effects of limiting the travel of the key 518 in the direction of actuation, as well as laterally, aim to suitably reduce the vibration of the keypad portion 510 without adversely affecting the tactility of the keypad assembly 154.

FIGS. 5 and 6 show two exemplary embodiments of the friction device 530. The friction device 530 shown in FIG. 5 is round and may be easily placed within the holes 522. The friction device 530 shown in FIG. 6 comprises two separate elongated members, each of which may be affixed to the inside circumference of holes 522 and may be secured in place with a suitable adhesive. In one example, the friction device 530 may be constructed of silicon or any suitable silicon compound. However, the friction device 530 may be constructed of any suitable material. Examples of various embodiments of friction devices 530 are discussed in more detail below in connections with FIGS. 7a, 7b, 8a, and 8b.

Figure 7A:
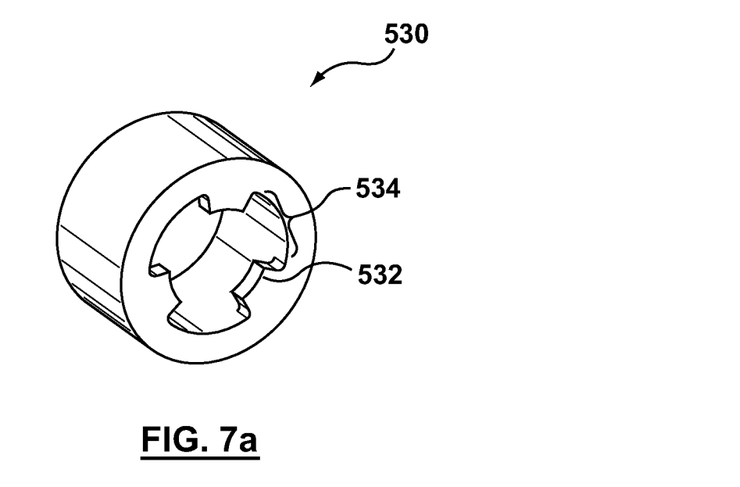
FIG. 7a shows a perspective view of one embodiment of a friction device suitable for use with the keypad shown in FIGS. 5 and 6.
Figure 7B:
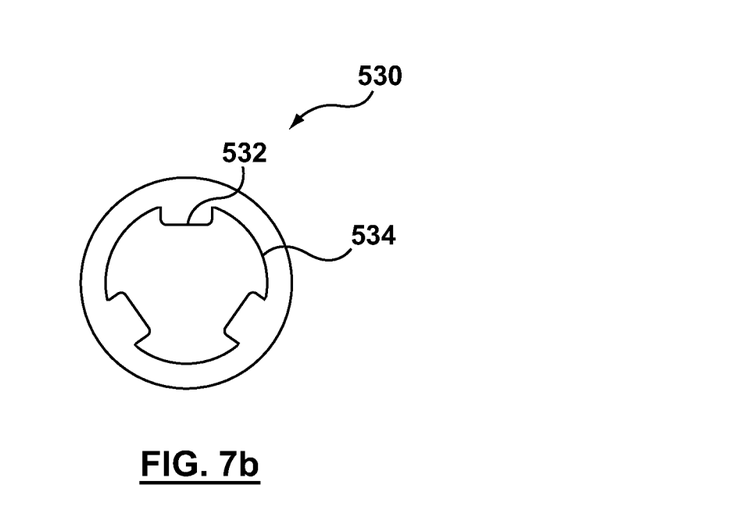

Reference is now made to FIGS. 7a and 7b. FIG. 7a illustrates a perspective view of one embodiment of the friction device 530. FIG. 7b illustrates a top plan view of the friction device shown in FIG. 7a. In the embodiment shown in FIGS. 7a and 7b, the friction device 530 may be round and may have a number of interference zones 532. The interference zones 532 may also be referred to as interference protrusions or friction mechanisms. In the example where the friction device 530 is round, the friction device 530 may be referred to as a grommet. The grommet may be press fitted into the holes 522 of the light guide 512. Alternatively, the friction device 530 may be moulded into the holes 522 of the light guide 512. In one example, the friction device 530 may be moulded into the holes 522 using a two-shot moulding process. The light guide 512 may receive any number of friction devices 530, from a single friction device 530 up to a maximum of one friction device 530 for each of the holes 522. In cases where the keypad portion 510 is a single FIP or IMD keypad, the use of a single friction device 530 provides a significant improvement, in particular with regards to reducing the lateral movement of the keypad portion 510. In one embodiment, anywhere from two to eight friction devices 530, such as the grommets shown in FIGS. 7a and 7b, may be used in the holes 522.

The friction devices 530 may have any number of interference zones 532. Additionally, the interference zones 532 may be of any suitable shape or size. In the example shown in FIGS. 7a and 7b, there are three interference zones 532, the minimum number needed for one friction device 530 to substantially limit the motion of one of the actuator posts 520 in a single plane normal to the direction of actuation. The interference zones 532 do not span the entire height of the friction device 530 (i.e., the height being defined in the direction of actuation or in the axial direction of an actuator post 520), as shown in FIG. 7a. However, the interference zones 532 may be of any suitable height, and in one embodiment, may span the entire height or axial length of the friction device 530. One objective in designing the shape and size of the interference zones 532 is to keep the interference zones 532 as small as possible such that the interference zones 532 interfere with the actuator posts 520 at the tolerance limits of the interface between the holes 522 and the actuator posts 520. Expressed another way, in one embodiment, the interference zones 532 may be designed such that, if the holes were as small as possible, yet still within the design tolerance limits, and the actuator posts were as large as possible, yet still within the design tolerance limits, the threshold would be reached where there would be interference between the interference zones 532 and the actuator posts 520. In one embodiment, there may be a generous clearance between adjacent interference zones 532, indicated by numeral 534. The clearance 534 allows for different shapes of actuator posts 520 to be used. For example, the actuator posts 520 may be circular, square, triangular, hexagonal, octagonal, oval, etc., or any other suitable shape.

In one embodiment where the friction device 530 is a grommet, the interference zones 532 may be equally spaced about the insider circumference of the grommet. The interference zones 532 are generally raised portions that extend inwardly from the inside circumference of the grommet, thereby decreasing the inside circumference of the grommet over a portion of the inside circumference of the grommet. The interference zones 532 may extend in length anywhere from a portion of the axial length of the grommet to the entire axial length of the grommet.

In another embodiment where the friction device 530 comprises one or more elongated members attached in the inside of the hole 522, the members may be equally spaced about the inside circumference of the hole 522. The members generally form raised portions that extend inwardly from the inside circumference of the hole 522, thereby decreasing the inside circumference of the hole over a portion of the inside circumference of the hole. The members may extend anywhere in length from a portion of the axial length of the hole to the entire axial length of the hole. Generally, the axial length of the hole 522 will be approximately equal to the thickness of the light guide 512.

Figure 8A:
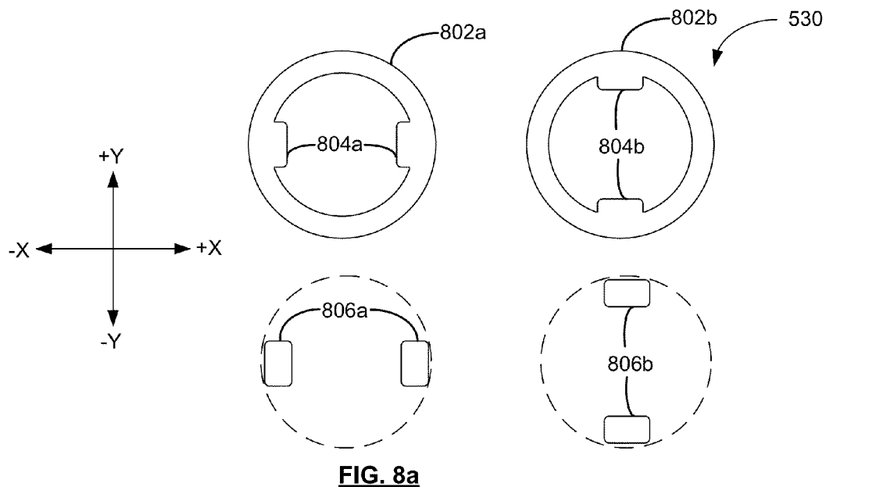
FIG. 8a shows a front plan view of another embodiment of friction devices suitable for use with the keypad shown in FIGS. 5 and 6.
Figure 8B:
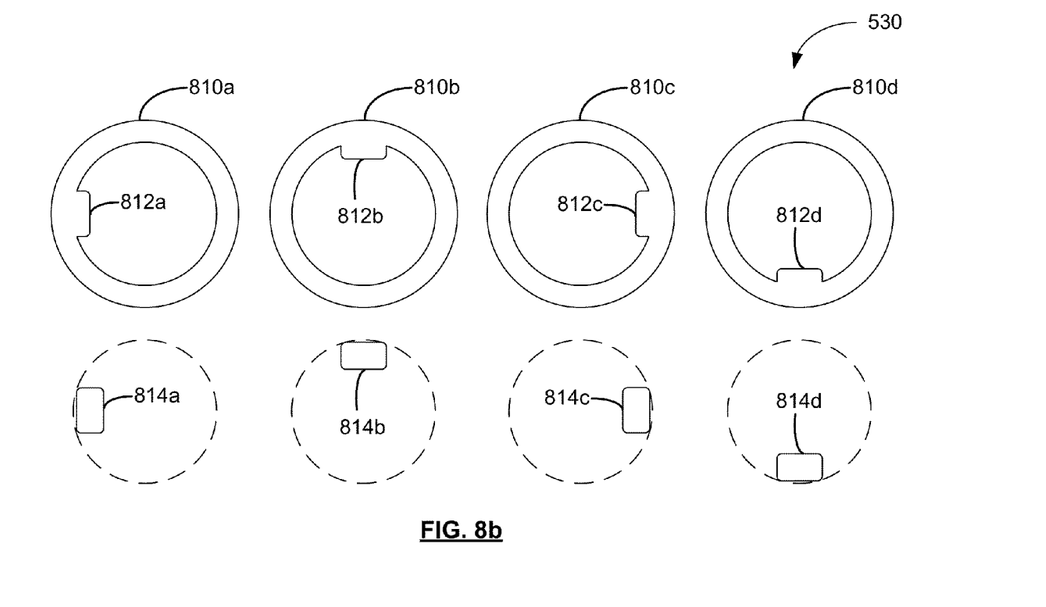
FIG. 8b shows a front plan view of another embodiment of friction devices suitable for use with the keypad shown in FIGS. 5 and 6.

Reference is now made to FIGS. 8a and 8b, which show a number of alternative embodiments of friction devices 530. The friction devices 530 are shown in an array to give some indication of how the friction devices 530 may be arranged in the holes 522 of the light guide 512. For clarity of description, new reference numbers are adopted for FIGS. 8a and 8b.

Referring first to FIG. 8a, two friction devices 802, individually indicated as 802a and 802b, are shown. The friction devices 802a and 802b, in the depicted example, may also be referred to as grommets. The friction devices 802a and 802b each have two interference zones 804a and 804b, respectively. Therefore, the friction devices 802 differ principally from the friction device 530 shown in FIGS. 7a and 7b in the number of interference zones that exist. Therefore, the friction devices 802a and 802b are generally the same as each other, although one is rotated ninety degrees with respect to the other, to show how the friction devices 802a and 802b would be installed in the holes 522. One of the objectives of the design of the friction devices 802 may be to apply some friction to the sides of the actuator posts 520, but limited to an amount of friction that is needed to substantially reduce unwanted vibration of the keypad portion 510 without adversely affecting the tactility of the keys 518. With each additional interference zone 804 that is added to a particular friction device 802, the potential for reduced tactility of the key 518 to which the associated actuator post 520 is connected increases. Hence, the friction devices 802 each having two interference zones 804 may represent an improvement over the friction device 530, having three interference zones 532. In some embodiments, the keypad portion 510 is a single FIP or IMD keypad. Therefore, in some embodiments, it may be desirable to reduce the number of interference zones 804 of each friction device 802, but use more friction devices 802 in the light guide 512.

For example, the friction device 802a shows two interference zones 804a positioned in the horizontal direction of FIG. 8a (e.g., in the X direction). The friction device 802b shows two interference zones 804b positioned in the vertical direction of FIG. 8a (e.g., in the Y direction). When the friction device 802a is fitted into one of the holes 522 of the light guide 512, the interference zones 804a of the friction device 802a will limit movement of a respective actuator post 520 in the +/−X direction because the interference zones 804a serve as a physical barrier preventing the actuator post 520 from moving in the +/−X direction. The interference zones 804a of the friction device 802a will also limit movement of the actuator post 520 in the direction of actuation of the actuator post 520 (e.g., in the +/−Z direction), due to the friction applied to the side of the actuator post 520. When the friction device 802b is fitted into another one of the holes 522 of the light guide 512, the interference zones 804b of the friction device 802b will limit movement of a respective actuator post 520 in the +/−Y direction because the interference zones 804b serve as a physical barrier preventing the actuator post 520 from moving in the +/−Y direction. The interference zones 804b of the friction device 802b will also limit movement of the actuator post 520 in the direction of actuation of the actuator post 520 (e.g., in the +/−Z direction), due to the friction applied to the side of the actuator post 520. Since, in this embodiment, the keypad 510 is a single FIP or IMD keypad, the overall effect of using at least one friction device 802a and at least one friction device 802b in the holes 522 is to significantly limit any movement of the keypad portion 510 in the X, Y, and Z directions. A user pushing the top of a key 518 in the direction of actuation of the key 518 will still be able to depress the respective electrical switch 516 by exerting enough force to overcome the friction applied to the side of the respective actuator post 520 and the actuation force needed to depress the respective electrical switch 516 (e.g., either 1.0, 1.35, or 1.6N, in some examples).

In another embodiment, FIG. 8a shows interference zones 806, individually indicated as 806a and 806b. In this example, the friction device is not formed in the shape of a grommet. Rather, the interference zones 806 are separately formed as two elongated members 806a and two elongated members 806b, a perspective view of which was shown as friction device 530 in FIG. 6. The elongated members 806a and 806b are then placed on the inside circumference of the holes 522, for example either moulded into the holes 522 or attached in the holes 522 using an adhesive. The elongated members 806 may be of any length, less than or equal to the axial length of the holes 522. In one example, the axial length of the holes 522 may be approximately equal to the thickness of the light guide 512. The elongated members 806 operate substantially in the same manner as described above in connection with the interference zones 804. The elongated members 806 have the advantage of being lighter than the friction devices 802, an important consideration in the construction of the portable wireless device 102.

Referring next to FIG. 8b, four friction devices 810, individually indicated as 810a, 810b, 810c, and 810d, are shown. The friction devices 810, in the depicted example, may also be referred to as grommets. The friction devices 810a, 810b, 810c, and 810d each have one interference zone 812a, 812b, 812c, and 812d, respectively. Therefore, the friction devices 810 differ from the friction devices 802 principally in the number of interference zones that exist. The friction devices 810a, 810b, 810c, and 810d are generally the same, although each is rotated ninety degrees with respect to the next, to show how the friction devices 810 would be installed in the holes 522. For example, whereas friction device 810a would limit movement of a respective actuator post 520 in the −X direction, the friction device 810c would limit movement of a respective actuator post 520 in the +X direction. Similarly, whereas friction device 810b would limit movement of a respective actuator post 520 in the +Y direction, the friction device 810d would limit movement of a respective actuator post 520 in the −Y direction. As mentioned earlier, one of the objectives of the design of the friction devices 810 may be to apply some friction to the sides of the actuator posts 520, but limited to an amount of friction that is needed to substantially reduce unwanted vibration of the keypad portion 510 without adversely affecting the tactility of the keys 518. With each additional interference zone 812 that is added to a particular friction device 810, the potential for reduced tactility of the key 518 to which the associated actuator post 520 is connected increases. However, in some embodiments, the keypad portion 510 is a single FIP or IMD keypad. Therefore, in some embodiments, it may be desirable to reduce the number of interference zones 812 of each friction device 810, but use more friction devices 810 in the light guide 512. Therefore, in some applications, the friction devices 810 may represent an improvement over the friction devices 802.

For example, the friction device 810a shows one interference zone 812a positioned in the horizontal direction of the FIG. 8b (e.g., limiting motion of a respective actuator post 520 in the −X direction). The friction device 810b shows one interference zone 812b positioned in the vertical direction of FIG. 8b (e.g., limiting motion of a respective actuator post 520 in the +Y direction). The friction device 810c shows one interference zone 812c positioned in the horizontal direction of FIG. 8b (e.g., limiting motion of a respective actuator post 520 in the +X direction). The friction device 810d shows one interference zone 812d positioned in the vertical direction of FIG. 8b (e.g., limiting motion of a respective actuator post 520 in the −Y direction). When the friction device 810a is fitted into one of the holes 522 of the light guide 512, the interference zone 812a of the friction device 810a will limit movement of a respective actuator post 520 in the −X direction because the interference zone 812a serves as a physical barrier preventing the actuator post 520 from moving in the −X direction. The interference zone 812a of the friction device 810a will also limit movement of the respective actuator post 520 in the direction of actuation of the actuator post 520 (e.g., in the +/−Z direction), due to the friction applied to the side of the actuator post 520. Similarly, when the friction device 810b is fitted into another one of the holes 522 of the light guide 512, the interference zone 812b of the friction device 810b will limit movement of the respective actuator post 520 in the +Y direction because the interference zone 812b serves as a physical barrier preventing the actuator post 520 from moving in the +Y direction. The interference zone 812b of the friction device 810b will also limit movement of the actuator post 520 in the direction of actuation of the actuator post 520 (e.g., in the +/−Z direction), due to the friction applied to the side of the actuator post 520.

Similarly, when the friction device 810c is fitted into one of the holes 522 of the light guide 512, the interference zone 812c of the friction device 810c will limit movement of a respective actuator post 520 in the +X direction because the interference zone 812c serves as a physical barrier preventing the actuator post 520 from moving in the +X direction. The interference zone 812c of the friction device 810c will also limit movement of the respective actuator post 520 in the direction of actuation of the actuator post 520 (e.g., in the +/−Z direction), due to the friction applied to the side of the actuator post 520. When the friction device 810d is fitted into another one of the holes 522 of the light guide 512, the interference zone 812d of the friction device 810d will limit movement of the respective actuator post 520 in the −Y direction because the interference zone 812d serves as a physical barrier preventing the actuator post 520 from moving in the −Y direction. The interference zone 812d of the friction device 810d will also limit movement of the actuator post 520 in the direction of actuation of the actuator post 520 (e.g., in the +/−Z direction), due to the friction applied to the side of the actuator post 520. Since, in this embodiment, the keypad portion 510 is a single FIP or IMD keypad, the overall effect of using at least one of each of the friction devices 810a, 810b, 810c, and 810d in the holes 522 is to significantly limit any movement of the keypad 510 in the +/−X, +/−Y, and +/−Z directions. Of course, a user pushing the top of a key 518 in the direction of actuation of the key 518 will still be able to depress the respective electrical switch 516 by exerting enough force to overcome the friction applied to the side of the respective actuator post 520 and the actuation force needed to depress the respective switch (e.g., either 1.0, 1.35, or 1.6N, in some examples).

In another embodiment, FIG. 8b shows interference zones 814, individually indicated as 814a, 814b, 814c, and 814d. In this example, the interference device is not formed in the shape of a grommet. Rather, the interference zones 814 are separately formed as elongated members 814a, 814b, 814c, and 814d. The elongated members are then placed on the inside circumference of the holes 522, for example either moulded into the holes 522 or attached in the holes 522 using an adhesive. The elongated members 814 may be of any length equal to or less than the axial length of the holes 522. In one example, the axial length of the holes 522 may be approximately equal to the thickness of the light guide 512. The elongated members 814 are arranged and operate in a similar manner as was described above in connection with the interference zones 812. The elongated members 814 have the advantage of being lighter than the friction devices 810, an important consideration in the construction of the portable wireless device 102.

The embodiments of the present disclosure described above are intended to be examples only. Those of skill in the art may effect alterations, modifications and variations to the particular embodiments without departing from the intended scope of the present disclosure. In particular, selected features from one or more of the above-described embodiments may be combined to create alternative embodiments not explicitly described, features suitable for such combinations being readily apparent to persons skilled in the art. The subject matter described herein in the recited claims intends to cover and embrace all suitable changes in technology.

The invention claimed is:

1. A keypad assembly for a handheld electronic device, comprising:
    a keypad having a keypad portion which includes a plurality of keys, each key having an actuator post attached to a back side thereof;
    a dome switch sheet having a plurality of dome switches, each dome switch corresponding to a key of the keypad;
    a light guide sheet located between the keypad and the dome switch sheet for illuminating the keypad portion, the light guide sheet defining a plurality of holes extending through the light guide sheet, each hole having an axial length defined by a thickness of the light guide sheet, each hole axially receiving an actuator post of a respective key and providing a path for the actuator post of the respective key for travel to contact a respective dome switch; and
    for each hole in the light guide sheet, a plurality of separate elongate members positioned therein, extending along the entire axial length of the hole and positioned between an inner surface of the light guide sheet defined by the hole and the actuator post received in the hole, the plurality of elongate members frictionally engaging the actuator post received in the hole in the light guide sheet thereby resisting movement of the actuator post in a direction of actuation.

2. The keypad assembly of claim 1, wherein the plurality of elongate members are moulded within the hole in the light guide sheet.

3. The keypad assembly of claim 1, wherein the plurality of separate elongate members are equally spaced circumferentially about the inside surface of the hole in the light guide sheet.

4. The keypad assembly of claim 1, further comprising:
    a bezel frame located in front of the keypad, the bezel frame defining an opening in the frame for each of the keys; and
    one or more light emitting diodes for providing light to the light guide sheet.

5. The keypad assembly of claim 1, wherein the plurality of elongate members are integrally formed with the light guide sheet.

6. A keypad assembly for a handheld electronic device, comprising:
    a keypad having a keypad portion which includes a plurality of keys, each key having an actuator post attached to a back side thereof;
    a dome switch sheet having a plurality of dome switches, each dome switch corresponding to a key of the keypad;
    a light guide sheet located between the keypad and the dome switch sheet for illuminating the keypad portion, the light guide sheet defining a plurality of holes extending through the light guide sheet, each hole having an axial length defined by a thickness of the light guide sheet, each hole axially receiving an actuator post of a respective key and providing a path for the actuator post of the respective key for travel to contact a respective dome switch; and
    for each hole in the light guide sheet, at least one elongate member extending along the entire axial length of the hole and positioned between an inner surface of the light guide sheet defined by the hole and the actuator post received in the hole, the at least one elongate member being attached to an inside surface of the hole in the light guide sheet using an adhesive, the at least one elongate member frictionally engaging the actuator post received in the hole in the light guide sheet, thereby resisting movement of the actuator post in a direction of actuation.

7. The keypad assembly of claim 6, wherein there is a plurality of separate elongate members positioned in each hole in the light guide sheet.

8. The keypad assembly of claim 7, wherein there are two separate elongate members in each hole, the two separate elongate members of each hole being positioned at opposite poles about a circumference of the inside surface of the hole.

9. The keypad assembly of claim 7, wherein the plurality of separate elongate members are equally spaced circumferentially about the inside surface of the hole in the light guide sheet.

10. The keypad assembly of claim 6, further comprising:

a bezel frame located in front of the keypad, the bezel frame defining an opening in the frame for each of the keys; and one or more light emitting diodes for providing light to the light guide sheet.

11. A handheld electronic device, comprising:

a microprocessor;

a keypad assembly, comprising:

- a keypad having a keypad portion which includes a plurality of keys, each key having an actuator post attached to a back side thereof;
- a dome switch sheet having a plurality of dome switches, each dome switch corresponding to a key of the keypad;
- a light guide sheet located between the keypad and the dome switch sheet for illuminating the keypad portion, the light guide sheet defining a plurality of holes extending through the light guide sheet, each hole having an axial length defined by a thickness of the light guide sheet, each hole axially receiving an actuator post of a respective key and providing a path for the actuator post of the respective key for travel to contact a respective dome switch; and
- for each hole in the light guide sheet, at least one elongate member extending along the entire axial length of the hole and positioned between an inner surface of the light guide sheet defined by the hole and the actuator post received in the hole, the at least one elongate member being attached to the inside surface of the hole in the light guide sheet using an adhesive, the at least one elongate member frictionally engaging the actuator post received in the hole in the light guide sheet, thereby resisting movement of the actuator post in a direction of actuation.

12. The handheld electronic device of claim 11, further comprising:

a bezel frame located in front of the keypad, the bezel frame defining an opening in the frame for each of the keys; and one or more light emitting diodes for providing light to the light guide sheet.

13. The handheld electronic device of claim 11, wherein there is a plurality of separate elongate members positioned in each hole in the light guide sheet.

14. The handheld electronic device of claim 13, wherein the plurality of separate elongate members are equally spaced circumferentially about the inside surface of the hole in the light guide sheet.

15. The handheld electronic device of claim 13, wherein there are two separate elongate members in each hole, the two separate elongate members of each hole being positioned at opposite poles about a circumference of the inside surface of the hole.

* * * * *